United States Patent
Bhakta et al.

(12) 
(10) Patent No.: US 6,482,573 B1
(45) Date of Patent: *Nov. 19, 2002

(54) EXPOSURE CORRECTION BASED ON REFLECTIVE INDEX FOR PHOTOLITHOGRAPHIC PROCESS CONTROL

(75) Inventors: Jayendra D. Bhakta, Sunnyvale, CA (US); Zicheng Gary Ling, San Jose, CA (US); Weizhong Wang, Sunnyvale, CA (US); Warren T. Yu, San Jose, CA (US); Eric Kent, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/492,216

(22) Filed: Jan. 27, 2000

Related U.S. Application Data

(60) Provisional application No. 60/170,764, filed on Dec. 15, 1999.

(51) Int. Cl.[7] .................................................. G03C 5/56
(52) U.S. Cl. ...................... 430/313; 430/30; 430/317; 430/950; 430/396; 430/394; 356/369
(58) Field of Search ................................ 430/313–317, 430/30, 950, 396, 394; 356/369

(56) References Cited

U.S. PATENT DOCUMENTS

| | | | | |
|---|---|---|---|---|
| 4,546,065 A | * | 10/1985 | Amendola et al. | 430/313 |
| 5,581,350 A | * | 12/1996 | Chen et al. | 356/369 |
| 5,763,135 A | * | 6/1998 | Ding et al. | 430/191 |

* cited by examiner

*Primary Examiner*—Mark F. Huff
*Assistant Examiner*—Daborah Chacko-Davis

(57) ABSTRACT

Critical dimension variation of photolithographically formed features on a semiconductor substrate is reduced by measuring the reflectivity of a photoresist layer and an underlying layer, such as a polysilicon layer, and adjusting the exposure level of the photoresist in accordance with the measured reflectivity. This allows precise control of feature width on the photoresist, which in turn allows precision etching of the underlying layer to accurately form a feature, such as a gate electrode.

7 Claims, 4 Drawing Sheets

EXPOSURE CORRECTION BASED ON REFLECTIVE INDEX FOR PHOTOLITHOGRAPHIC PROCESS CONTROL

RELATED APPLICATIONS

This application claims priority from U.S. Provisional Patent Application Serial No. 60/170,764, filed on Dec. 15, 1999, which is incorporated herein by reference.

FIELD OF THE INVENTION

The present invention relates to a method of manufacturing semiconductor devices, and is particularly useful in manufacturing high density semiconductor devices with submicron design features. The invention is particularly applicable in manufacturing semiconductor devices having features in the deep submicron range with reduced critical dimensions.

BACKGROUND OF THE INVENTION

Conventional semiconductor devices comprise a substrate having various electrically isolated regions, called active regions, in which individual circuit components are formed. The active regions typically comprise source/drain regions formed in the semiconductor substrate by implantation of impurities, spaced apart by a channel region on which a gate electrode is formed with a gate oxide layer therebetween. The gate electrode controls the turn-on and turn-off of each circuit component.

The electrical isolation of these active regions is typically accomplished by thermal oxidation of the semiconductor substrate, typically monocrystalline silicon or an epitaxial layer formed thereon, forming the active regions. One type of isolation structure is known as trench isolation, wherein shallow trenches are etched in the substrate and an oxide liner is thermally grown on the trench walls. The trench is then filled with an insulating material. The resulting structure is referred to as a shallow trench isolation (STI) structure.

A typical method of STI formation comprises initially growing a pad oxide layer on the substrate, and depositing a nitride, e.g., silicon nitride, polish stop layer thereon. A photoresist mask is then applied to the nitride layer, and a pattern defining the trench areas is formed in the photoresist mask. This is accomplished by a photolithographic process in which selected areas of the photoresist are exposed to light via a mask or reticle and thereafter developed to form apertures extending to and exposing portions of the underlying nitride layer. The exposed portions of the nitride layer are etched away, followed by the pad oxide layer. The etching continues into the substrate to form the shallow trench. When etching of the trench is completed, the photoresist is stripped from the nitride layer.

Next, the substrate is oxidized to form an oxide liner on the walls and base of the trench to control silicon-silicon oxide interface quality. The trench is then filled with an insulating material (or "trench fill"), such as silicon dioxide derived from tetraethylorthosilicate (TEOS). The surface is then planarized, as by chemical-mechanical polishing (CMP) using the nitride layer as a polish stop, and the remaining nitride and pad oxide are stripped off from the active areas to complete the trench isolation structure.

Next a gate oxide layer is formed over the STI structure by thermal oxidation, followed by application of a polysilicon layer and another photoresist layer. The polysilicon layer is etched to form the gate electrode. Patterning of the polysilicon layer is carried out by a photolithographic process similar to that described above in connection with STI formation; that is, the photoresist layer is exposed to light via a mask or reticle and developed to form a pattern exposing portions of the underlying polysilicon layer, which are then etched.

The photoresist patterning must be highly precise to enable accurate etching of the underlying layer. For example, random variations in pattern dimensions can result in unacceptable variation in gate electrode width and high electrode failure rate.

As used herein, the term "critical dimension" or "CD" refers to the design rule for features on a semiconductor substrate such as a gate electrode. Because these features are formed by patterns on the photoresist, CD also reflects the precision needed for forming the pattern in the photoresist. Current generation semiconductor technologies have a CD of 0.25 microns or less, in some instances as low as 0.15 microns or less, or even as low as 0.12 microns or less. A CD of 0.12 microns means that this is the minimum width required for a feature, such as a gate electrode, to achieve acceptable quality control and reject rates. The lower the CD, the more densely packed the features on a semiconductor substrate can be.

Critical dimension accuracy of photolithographically formed features is adversely affected (i.e., increased or decreased) by high reflectivity of the photoresist layer and the underlying layer, such as an oxide or polysilicon layer. Both layers are substantially transparent, and, hence, during the exposure step of the photolithography process, light penetrates through these layers and is reflected back. This increases the exposure area on the photoresist, resulting in correspondingly larger apertures. Normally, the exposure level can be adjusted to account for a constant reflectivity level from the photoresist and underlying layers. However, the amount of reflectivity can vary with layer thickness and refractive index. Due to the refractive index mismatch of the photoresist and underlying layers, normal variations in layer thickness have a large effect on reflectivity. Thus small thickness variations in the photoresist or underlying layer result in a large "swing effect", defined as the change in critical dimension as a function of layer thickness.

CD variation as function of layer thickness can be seen with reference to FIGS. 1–5. FIG. 1 illustrates a semiconductor device 10 provided with source/drain regions 12, channel region 14, gate oxide layer 16, and gate electrode 18. The gate electrode 18 of FIG. 1 has the proper dimensions, i.e., its width extends between the source drain regions 12 above the channel region 14. FIG. 2 illustrates the formation of aperture 20 in a photoresist layer used in the formation of a gate electrode. In FIGS. 2–5, source/drain regions 12 are depicted using dotted lines, because these areas are typically formed subsequent to gate electrode formation. The photoresist layer 22 and the polysilicon layer 24 have a variable thickness (exaggerated in FIG. 2) which causes variation in the reflectivity during the exposure step. Because of this, the apertures 20 can vary in size. As shown in FIG. 2, apertures 20 are smaller because the polysilicon layer and/or the photoresist layer is thinner than anticipated in the exposed regions. This results in a gate electrode 26 as shown in FIG. 3 having a width greater than the design specification.

The opposite effect is shown in FIGS. 4 and 5. In FIG. 4, one or both of the photoresist or polysilicon layers are thicker in the regions exposed to light in the lithographic process. This results in larger aperture 28 and subsequently a smaller gate electrode 30 after the etching process. Thus, the semiconductor device is not within design specification.

One method of reducing reflectivity and consequently CD variation is to provide an antireflective coating between the underlying layer and the photoresist layer. Such coatings reduce the amount of light reflected back into the photoresist layer by partially absorbing the light after it passes through the photoresist. However, antireflective coatings do not completely eliminate swing effects since some light is still reflected and therefore effects photoresist aperture size and etch areas on the polysilicon layer. Moreover, they require an additional manufacturing step to apply and can themselves have an adverse impact on failure rate.

Hence, there remains a need in the art for a method for further reducing CD swing effect to allow more precise control of feature dimension and hence a reduction in CD variation.

SUMMARY OF THE INVENTION

It is accordingly an aspect of the invention to provide a method for manufacturing a semiconductor device that allows more precise control of critical dimension. It is another aspect of the invention to provide a method of manufacturing a semiconductor device that does not require the application of additional layers to the device to reduce reflectivity.

These aspects and others set forth hereinbelow are achieved by method of manufacturing a semiconductor device, the method comprising forming a first layer on a silicon substrate; applying a photoresist layer on the first layer; measuring the reflectivity of light passing through a portion of the photoresist layer and of a corresponding portion of the first layer; selecting a photolithographic exposure level based on the measured reflectivity; and exposing said portion of the photoresist layer at the selected exposure level. The process of measuring the reflectivity of a portion of the layers, selecting the proper exposure level and then exposing the photoresist portion, is repeated for different portions of the photoresist until the entire photoresist is exposed. Thereafter, the photoresist is developed and the underlying layer etched, thereby forming features having substantially less critical dimension variation than features formed by conventional processes.

DESCRIPTION OF THE INVENTION

For a full understanding of the invention, the following detailed description should be read in conjunction with the drawings, wherein.

DETAILED DESCRIPTION OF THE INVENTION

The present invention addresses and solves the problem of CD variation due to variation in reflectivity of the photoresist layer and/or underlying layer used in forming a semiconductor device. The Variation in CD adversely affects the ability of conventional photolithographic techniques to form features with fine dimensions, e.g., less than about 0.25 microns, particularly less than about 0.12 microns. The present invention enables the manufacture of semiconductor devices with consistently low CD variation, which enables reduction of CD and, hence, very dense packing of features.

According to the methodology of the present invention, a thin film, such as a polysilicon or oxide layer, is applied over a silicon substrate and etched via a patterned photoresist layer formed on the thin film layer. In the process of patterning the photoresist, the reflectivity of the photoresist layer and the underlying layer are monitored and the stepper exposure level is adjusted accordingly. Thus, for example, if a higher than normal reflectivity is detected in a given area or portion of the photoresist layer, then the exposure level is reduced. Conversely, if the reflectivity is lower than normal, the level of exposure is increased. The feedback loop of the present invention therefore enables a reduction in CD variation due to the photolithography process.

Figure 1:
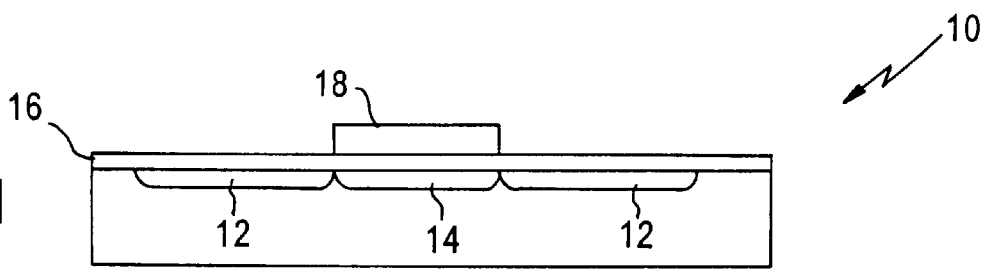
FIG. 1 is a cross-sectional view of a semiconductor device with a properly sized gate electrode.
Figure 2:
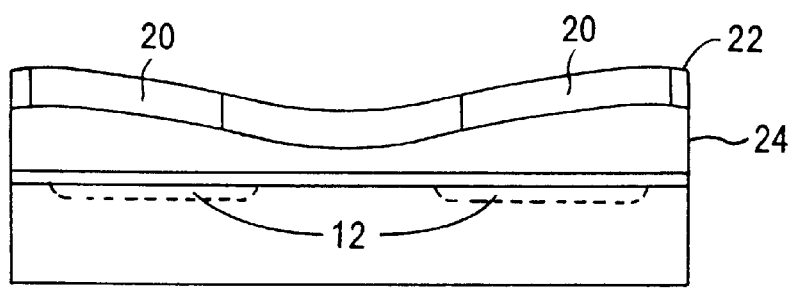
FIGS. 2–5 illustrate the formation of gate electrodes having a width outside design specification due to excessive reflectivity of the polysilicon layer and/or the photoresist layer.
Figure 3:
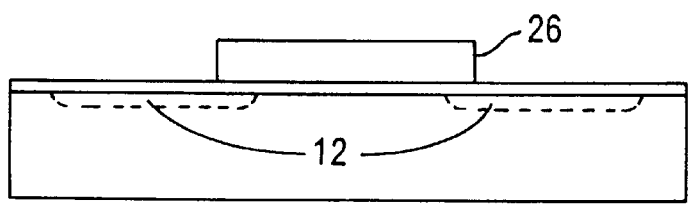
Figure 4:
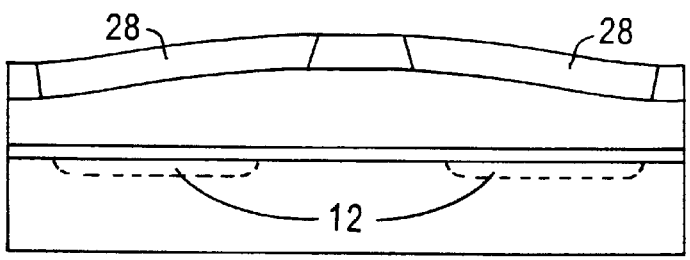
Figure 5:
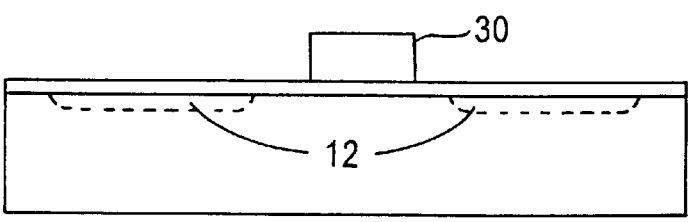
Figure 6:
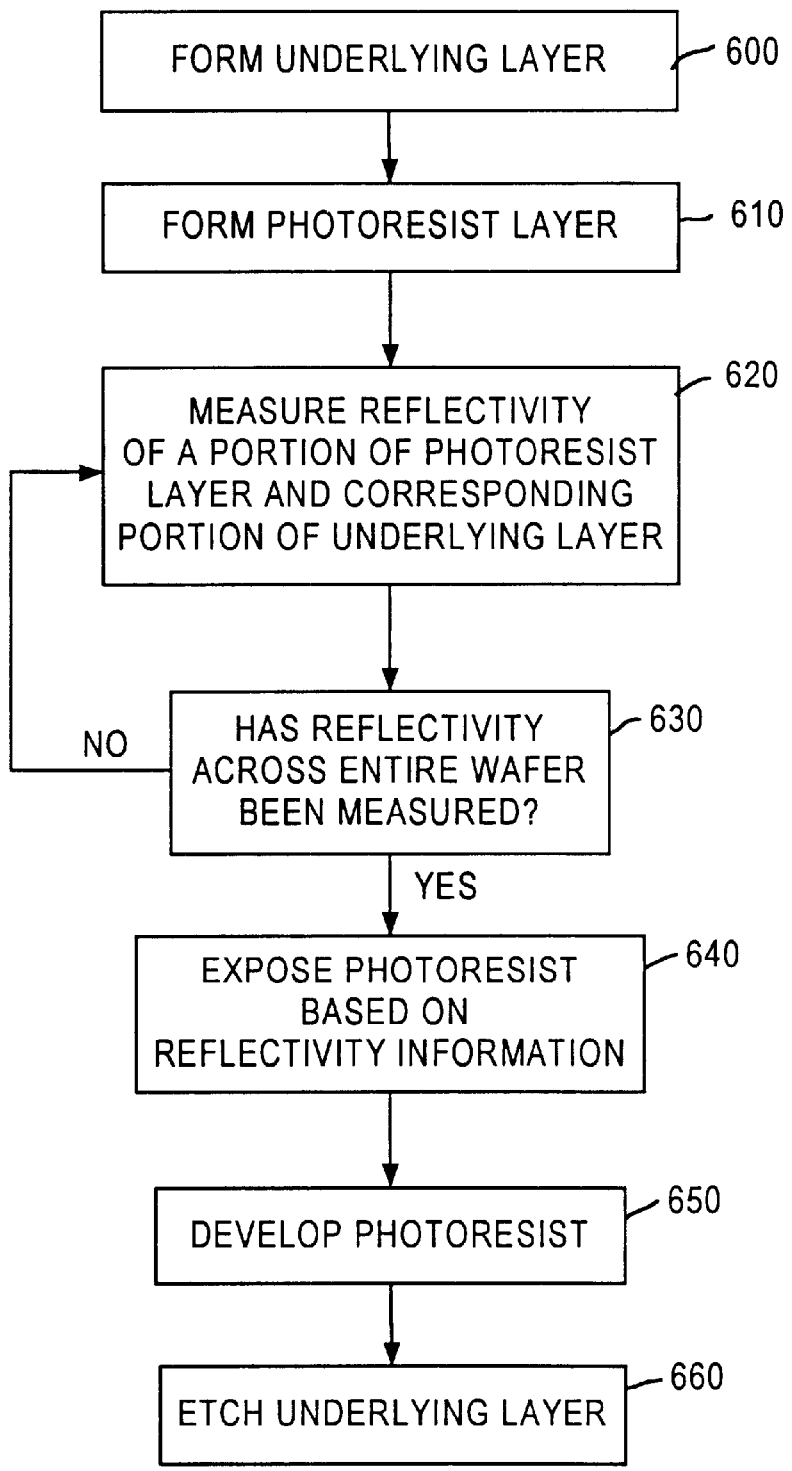
FIG. 6 is a flow chart illustrating sequential steps for practicing the present invention.
Figure 7:
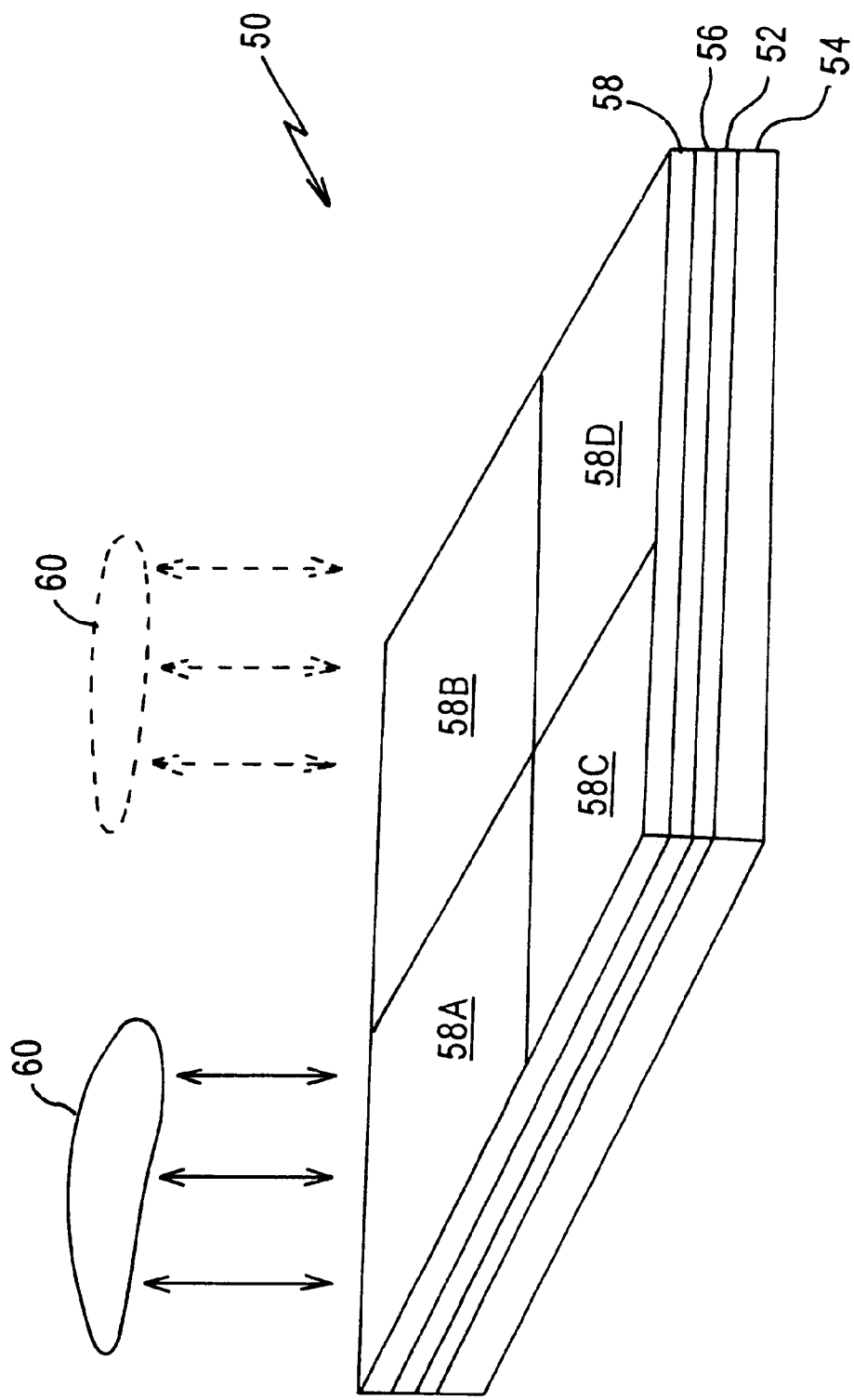
FIG. 7 illustrates measurement of reflectivity using an ellipsometer, according to an embodiment of the present invention.
Figure 8:
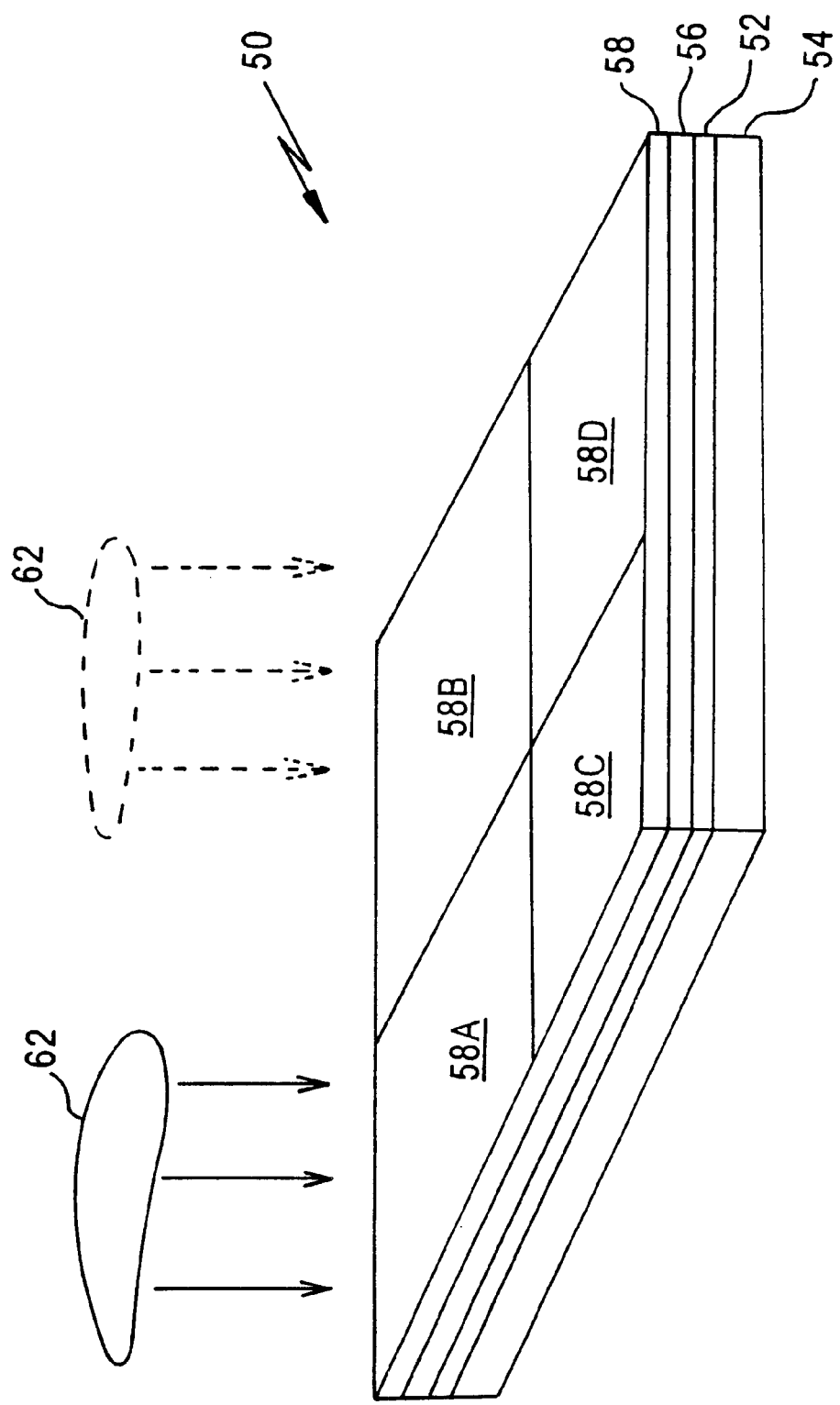
FIG. 8 illustrates exposure of a photoresist layer with a stepper, according to an embodiment of the present invention.

One embodiment of the present invention is illustrated in the flow chart of FIG. 6 and in FIGS. 7 and 8, using the formation of a patterned polysilicon gate as an example. However, it should be understood by those skilled in the art that the present invention is applicable-to any layer that is patterned using photolithography, such as an oxide layer or a metal layer. To determine stepper exposure level, the photoresist is "mapped" for reflectivity resulting from the photoresist layer and the underlying layer prior to the exposure step. This can be accomplished in a number of ways, for example, via an ellipsometer. Once reflectivity values are assigned to the entire composite, the photoresist layer is exposed based on the reflectivity values.

Referring now to FIG. 7, a semiconductor composite is indicated generally by the number 50. A thermally grown gate oxide layer 52 is located above a silicon substrate 54. Atop gate oxide layer 52, a polysilicon layer 56 is formed (see step 600) as an underlying layer, as by chemical vapor deposition (CVD). A photoresist layer 58 is formed at step 610 over polysilicon layer 56 and is divided, for purposes of illustration, into four areas 58A through 58D. However, when practicing the present invention, the number of areas is typically much greater than four. At step 620, the reflectivity of light passing through portion 58A of photoresist layer 58 and a corresponding portion of underlying polysilicon layer 56 is measured by an instrument, such as a conventional ellipsometer 60. Then, if it is determined at step 630 that the entire photoresist layer 58 has not been mapped for reflectivity, measuring step 620 is repeated for another portion of photoresist layer 58 (e.g., portion 58B).

After the reflectivities for all portions of photoresist layer 58 have been measured by ellipsometer 60, for each area 58A–D, a stepper 62 provides a preset level of light exposure as a function of the associated reflectivity at that portion of photoresist layer 58 (see step 640). For example, the exposure level, as measured by time and intensity, will be less for the exposure of area 58A than for area 58B if photoresist layer 58 has a higher reflectivity in area 58A than in area 58B.

Generally, a conventional stepper 62 is used to expose photoresist 58, wherein different areas 58A–58D of photoresist 58 are exposed in sequence by movement of stepper 62 or substrate 54, with adjustments made in the exposure level based on the measured reflectivity of the particular area 58A–58D. Depending on the randomness of the reflectivity variation of photoresist 58, stepper 62 may perform from 1 to 10 or even more exposures at a given exposure level before an adjustment is called for. To accomplish exposure adjustment, stepper 62 can be programmed to vary the "dwell" or residence time in a particular portion 58A–58D of photoresist 58 as a function of the measured reflectivity for that area. Software and circuitry to accomplish this are well known to one of ordinary skill in the art. Typically, the dwell time is a function of the light intensity, but in general can vary from about $1/10000$ to about $1/30$ sec. Although varying the dwell time is a preferred method of varying exposure, it is also possible to vary exposure via change of the light intensity.

After the photolithographic process is completed, photoresist 58 is developed (step 650) and underlying polysilicon layer 56 is etched (step 660) in a known manner. Polysilicon features formed using the present methodology exhibit substantially less critical dimension variation than features formed using conventional photolithographic methodologies, since the reflectivity variations due to photoresist and polysilicon thickness variations have been taken into consideration when setting stepper exposure levels.

The present invention is applicable to the manufacture of various types of semiconductor devices, particularly high-density semiconductor devices having a design rule of about $0.25\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising;

(a) forming a first layer on a silicon substrate;

(b) applying a photoresist layer on the first layer;

(c) measuring a reflectivity of light passing through a portion of the photoresist layer and of a corresponding portion of the first layer;

(d) selecting a photolithographic exposure level based on the measured reflectivity;

(e) exposing said portion of the photoresist layer at the selected exposure level; and (f) repeating steps (c), (d), and (e) for another portion of the photoresist layer.

2. The method of claim 1 comprising measuring the reflectivity using an ellipsometer.

3. The method of claim 1, comprising selecting the photolithographic exposure level by adjusting an exposure time.

4. method of claim 3, wherein the exposure time is from about $1/1000$ sec to about $1/30$ sec.

5. The method of claim 1, further comprising:

(g) developing the exposed portions of the photoresist; and (h) etching the first layer.

6. The method as claimed in claim 5, wherein a critical dimension of the developed photoresist in step (g) is less than about 0.25 micron.

7. The method of claim 5, wherein a critical dimension of the developed photoresist in step (g) is less than about 0.12 micron.

* * * * *